US009251876B1

(12) United States Patent (10) Patent No.: US 9,251,876 B1
Gamsa et al. (45) Date of Patent: *Feb. 2, 2016

(54) RETIMING PROGRAMMABLE DEVICES INCORPORATING RANDOM ACCESS MEMORIES

(71) Applicant: Altera Corporation, San Jose, CA (US)

(72) Inventors: Benjamin Gamsa, Toronto (CA); Gordon Raymond Chiu, North York (CA)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/560,153

(22) Filed: Dec. 4, 2014

Related U.S. Application Data

(63) Continuation of application No. 14/243,102, filed on Apr. 2, 2014, now Pat. No. 8,929,152.

(51) Int. Cl.
*G11C 7/00* (2006.01)
*G11C 7/20* (2006.01)
*G11C 7/10* (2006.01)
*G11C 7/06* (2006.01)
*G11C 7/22* (2006.01)

(52) U.S. Cl.
CPC .. *G11C 7/20* (2013.01); *G11C 7/06* (2013.01); *G11C 7/1051* (2013.01); *G11C 7/22* (2013.01)

(58) Field of Classification Search
CPC ........... G11C 7/22; G11C 7/06; G11C 7/1051
USPC .................. 365/189.011, 233.5, 233, 189.01, 365/185.05
See application file for complete search history.

(56) References Cited

U.S. PATENT DOCUMENTS

| 5,630,154 | A | * | 5/1997 | Bolstad | G06F 15/8046 |
| | | | | | 342/159 |
| 6,414,903 | B1 | | 7/2002 | Keeth et al. | |
| 7,570,522 | B2 | * | 8/2009 | Hara | G11C 16/10 |
| | | | | | 365/185.05 |
| 7,948,812 | B2 | | 5/2011 | Ware | |
| 8,296,696 | B1 | * | 10/2012 | Chiu | G06F 17/5054 |
| | | | | | 716/104 |
| 8,422,263 | B2 | | 4/2013 | Saito et al. | |

OTHER PUBLICATIONS

Pan, P., et al., "Optimal Retiming for Initial State Computation", *Proceedings of the 12th International Conference on VLSI Design—VLSI for the Information Appliance*', pp. 366-371, Jan. 10-13, 1999.
Stok, L., et al., "Improving Initialization through Reversed Retiming", *Proceedings for the 1995 European Conference on Design and Test*, IEEE Computer Society, pp. 150-154, 1995.

* cited by examiner

*Primary Examiner* — Connie Yoha
(74) *Attorney, Agent, or Firm* — Ropes & Gray LLP; Jeffrey H. Ingerman (57) ABSTRACT

A method of retiming a circuit that includes a RAM having data stored therein, a register following the RAM, and registers preceding the RAM for registering input, address and enable signals of the RAM includes pushing a value in the register following the RAM back into a memory location in the RAM, pushing back data stored in the RAM and initial values in the registers preceding the RAM to accommodate the value pushed back from the register following the RAM, and setting new values in the registers preceding the RAM so that, on a first clock cycle after retiming, the circuit assumes a condition before retiming. The method also may be used to configure a programmable logic device with a user logic design.

20 Claims, 9 Drawing Sheets

RETIMING PROGRAMMABLE DEVICES INCORPORATING RANDOM ACCESS MEMORIES

CROSS REFERENCE TO RELATED APPLICATION

This is a continuation of commonly-assigned U.S. patent application Ser. No. 14/243,102, filed Apr. 2, 2014, now U.S. Pat. No. 8,929,152, which is hereby incorporated by reference herein in its entirety.

FIELD OF THE INVENTION

This invention relates to design or configuration methods for integrated circuit devices, including, e.g., field-programmable gate array (FPGAs) or other types of programmable logic devices (PLDs), which incorporate random access memories (RAMS), and to design or configuration methods, for designing or configuring such devices, where the methods provide the ability to retime the design or configuration in the presence of a RAM.

BACKGROUND OF THE INVENTION

Early programmable devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations.

While it may have been possible to configure the earliest programmable logic devices manually, simply by determining mentally where various elements should be laid out, it was common even in connection with such earlier devices to provide programming software that allowed a user to lay out logic as desired and then translate that logic into a configuration for the programmable device. With current larger devices, it would be impractical to attempt to lay out the logic without such software.

Some user logic designs would be able to operate at higher clock speeds if the designs could be retimed—e.g., by inserting pipeline registers at various locations in the designs. However, some programmable devices include RAMs, and a user logic design may include initializing the contents of the RAM, which may complicate retiming efforts.

SUMMARY OF THE INVENTION

Known configuration methods for programmable integrated circuit devices may not properly account for the ability to "retime" a design by moving registers within the design. Even configuration methods that do account for retiming may have difficulties when a design includes an initialized RAM, particularly where registers are moved backwards through the RAM.

The present invention provides methods for retiming a logic design, including an initialized RAM, including moving a register backwards through the RAM, by moving the register back not only on the data path but also on the read and write address paths. The values on the read and write address paths are set so that on the next cycle, the RAM assumes its pre-retiming initialized state. The invention presupposes that the RAM is either a dual-port RAM, or a single-port RAM of a type which allows reading and writing simultaneously from and to the address on the single port, where, in either case, the old value at an address may be read as a new value is written to that address.

Therefore, in accordance with the present invention there is provided a method of retiming a circuit that includes a RAM having data stored therein, a register following the RAM, and registers preceding the RAM for registering input, address and enable signals of the RAM. The method includes pushing a value in the register following said RAM back into a memory location in the RAM, pushing back data stored in the RAM and initial values in the registers preceding the RAM to accommodate the value pushed back from the register following the RAM, and setting new values in the registers preceding the RAM so that, on a first clock cycle after retiming, the circuit assumes a condition before retiming.

There is also provided a method of configuring an integrated circuit device with a user logic design incorporating an initialized RAM. The method includes identifying initialization conditions of the RAM and an output register thereof, and retiming the RAM. The retiming includes pushing initialization values of input, address and enable registers of the RAM backward through the integrated circuit device, pushing an initialization value of the output register to a memory location in the RAM, and setting new values of the input, address and enable registers so that starting from those new values, the RAM will achieve the initialization conditions after one clock cycle. The initialization values and the new values are incorporated into a configuration for the integrated circuit device, and the configuration is applied to the integrated circuit device.

A machine-readable data storage medium encoded with instructions for carrying out such a method also is provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

The purpose of retiming is to reposition registers in a circuit so as to minimize cycle time while preserving the existing behavior of the circuit. Registers may be moved forwards or backwards in an attempt to balance the delay between all pairs of registers, thus reducing the maximum delay and hence the cycle time.

Figure 1:
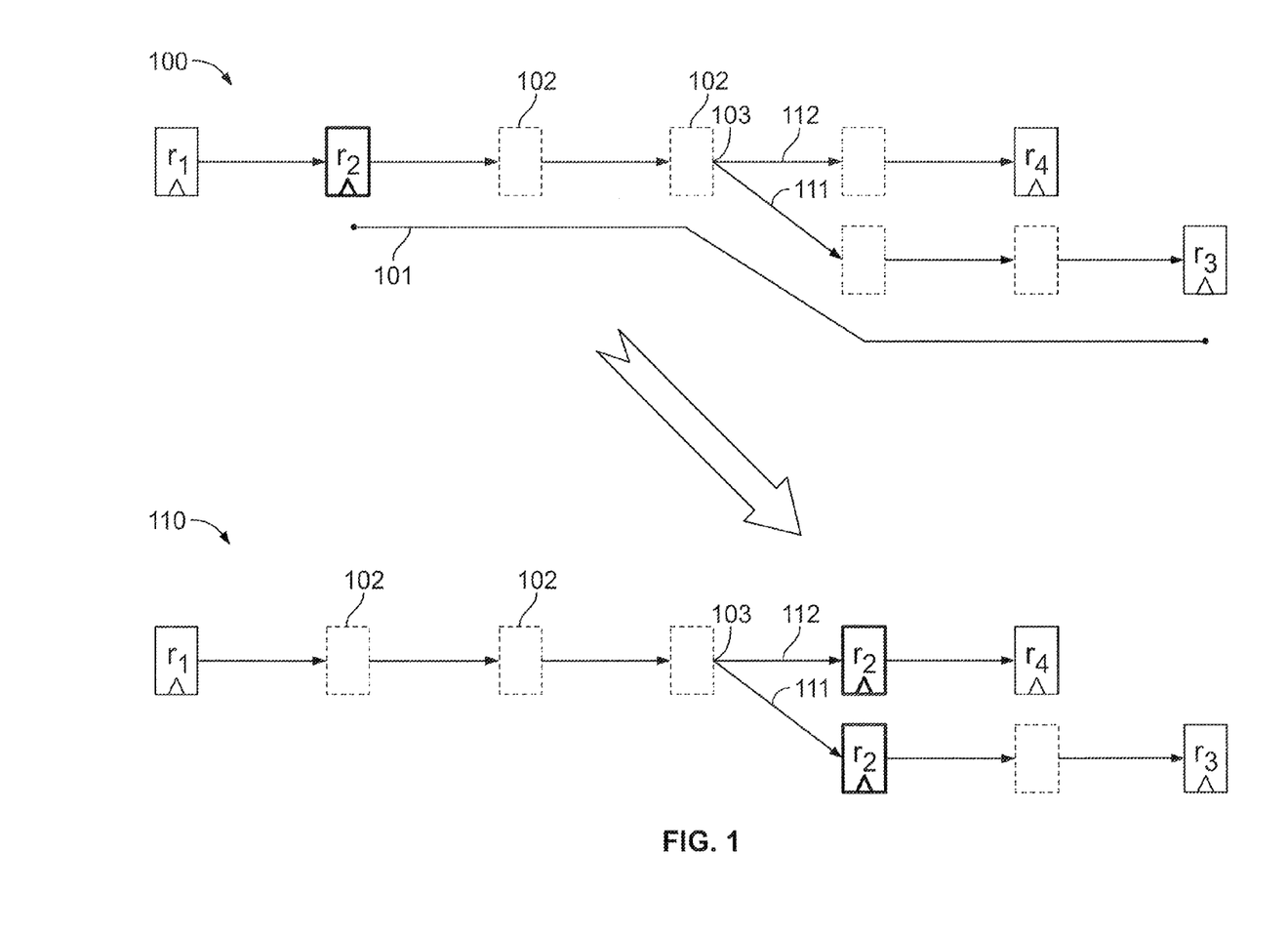
FIG. 1 shows an example of forward retiming of registers across a multiple fan-out node.

When registers move across nodes with multiple fan-ins or fan-outs, the same move must be made across all branches to preserve functionality. This is illustrated in the example in FIG. 1. In original circuit 100, it may be determined that there is a critical path 101 from register $r_2$ to register $r_3$ that is limiting performance. One solution may be to retime circuit 100 by moving register $r_2$ forward three positions (past various combinational nodes 102) to eliminate critical path 101. However, because there is a branch point 103 between register $r_2$ and register $r_3$ in circuit 100, retiming must duplicate register $r_2$ along both paths 111, 112 in retimed circuit 110 so that signals on both branches arrive at the same relative times that they would have in circuit 100. In this example, if register $r_2$ were not duplicated in path 112, then instead of three clocks between register $r_1$ and register $r_3$ as well as three clocks between register $r_1$ and register $r_4$ as in circuit 100, in circuit 110 there would be three clocks between register $r_1$ and register $r_3$ (path 111), but only two clocks between register $r_1$ and register $r_4$ (path 112).

Figure 2:
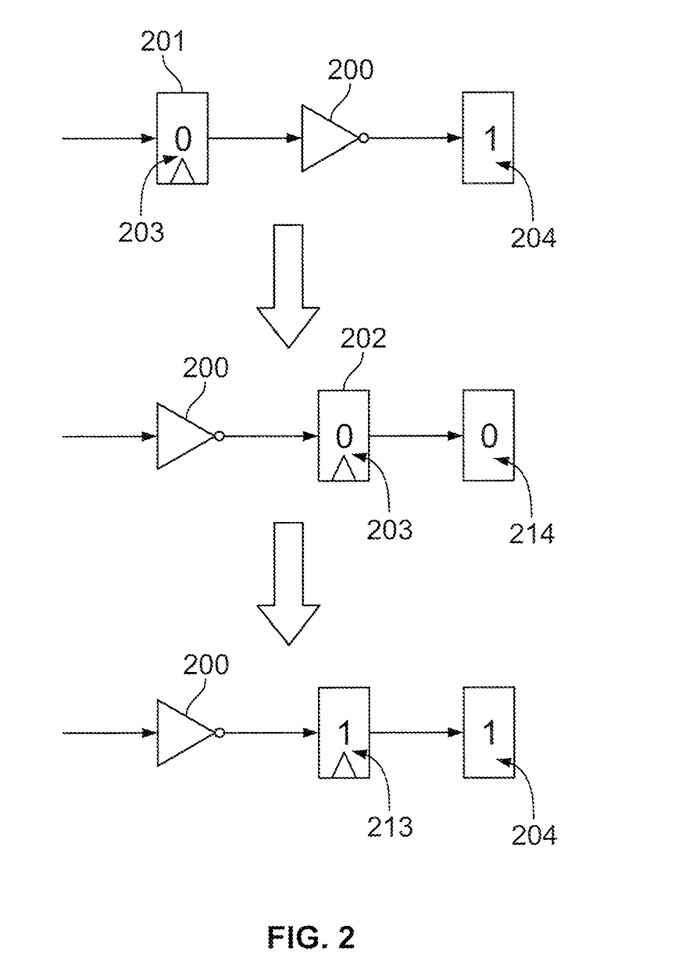
FIG. 2 shows an example of how the initial state of a register may need to be changed after retiming.

In addition, depending on the nature of the move, the initial state of a register that has been moved may have to change to preserve the function of the circuit. For example, as shown in FIG. 2, if a register is moved from position 201 before an inverter 200 to position 202 after inverter 200, but its contents 203 are not changed, then circuit output 204 is changed to output 214 until contents 213 are changed to restore output 204.

Figure 3:
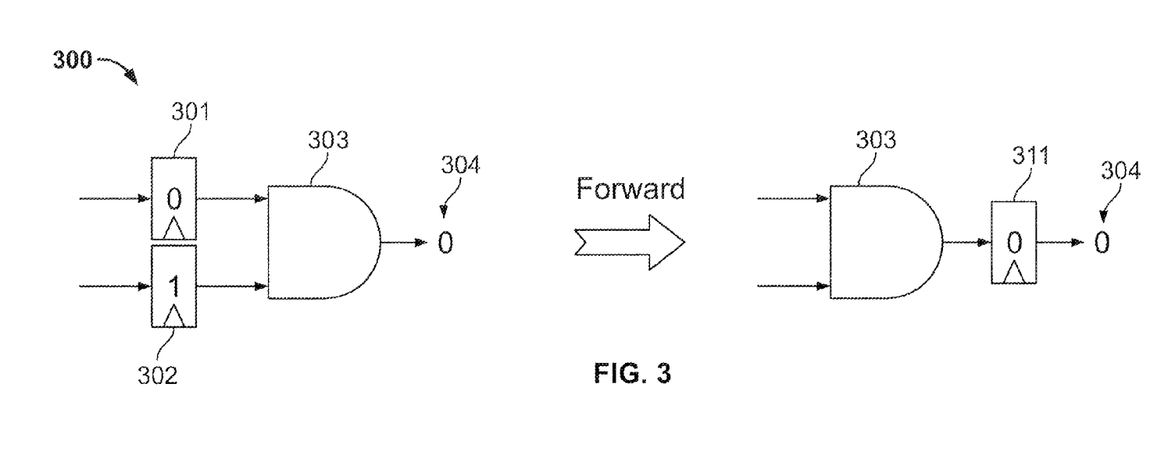
FIG. 3 shows an example of forward retiming of registers across a multiple fan-in node.

FIG. 3 shows an example 300 of forward retiming through a fan-in node. If two registers 301, 302 before AND-gate 303 are initialized with a '0' and a '1', respectively, resulting in '0' output 304, then in accordance with the principles discussed above, forward retiming results in only one register 311 following AND-gate 303. To maintain output 304 in the correct state, the value in register 311 is a '0'. The same would be true if each of registers 301, 302 contained a '0', or if registers 301, 302 contained '1' and '0', respectively. However, if each of registers 301, 302 contained a '1', then to maintain output 304 in the correct state, the value in register 311 would be a '1'.

Figure 4:
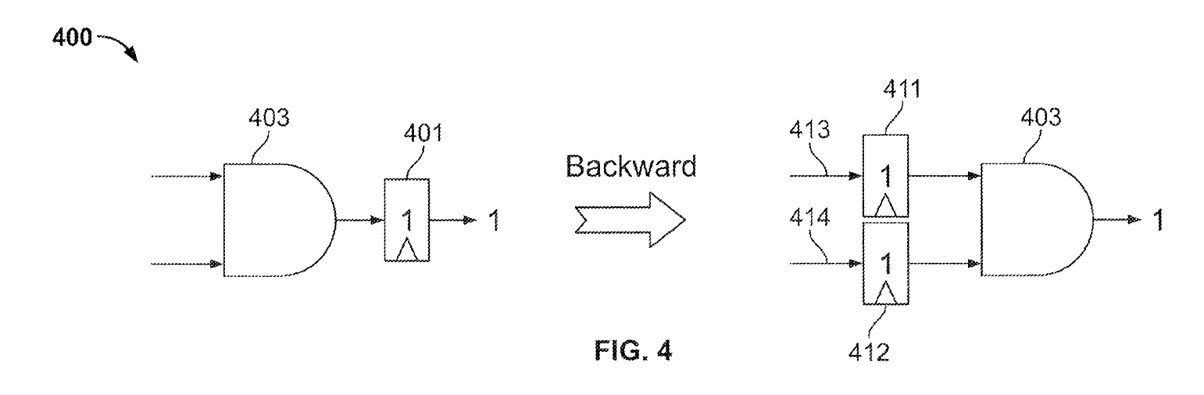
FIG. 4 shows an example of backward retiming of registers across a multiple fan-in node.

FIG. 4 shows an example 400 of backward retiming through a fan-in node. If single register 401 before AND-gate 403 is retimed backward, then as discussed above, to maintain timing in both fan-in branches 413, 414, a register 411, 412 must be added in each fan-in branch 413, 414. And if single register 401 were initialized with a '1', then to maintain that output, both retimed registers 411, 412 would be initialized with a respective '1'. But if single register 401 were initialized with a '0', then that output could be maintained with both retimed registers 411, 412 initialized to '0', or with either one of registers 411, 412 initialized to '0' and the other one of registers 411, 412 initialized to '1'.

Figure 5:
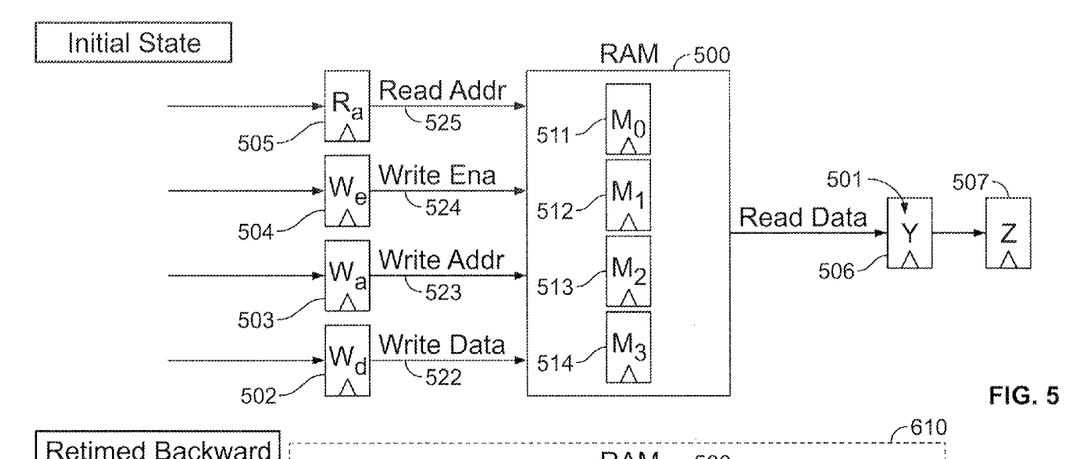
FIG. 5 shows an example of an initial state of a dual-port RAM to which backward retiming of registers may be applied.

The foregoing examples were relatively straightforward. But retiming a register through a RAM, particularly backwards through a RAM, is more complicated. As seen in FIG. 5, if RAM 500 had been operating, a registered output 501 of a RAM 500 would be data that had been stored in one of cells 511-514 of RAM 500 after previously having been entered via write data input 502 (although in this case, the conditions in FIG. 5 represent a user-defined initial state). As in the case of the combinational logic nodes described above, to retime backward, a register needs to be pushed back on all inputs 502-505. But the difference from combinational logic nodes is that whereas for a combinational node the inputs are computed by reversing the function of the node to compute the inputs that give the desired output, in the case of the RAM, because it does not compute a mathematical function, reversing its behavior is more involved (in this case, not all inputs 502-505 are related to the output data 501, but include address and enable signals).

Rather, in accordance with embodiments of the present invention, the values to be pushed back into registers 503-505 are the values needed so that on a first clock cycle, the desired initial conditions are restored. That means that after retiming, the contents of some location of the RAM would match the pre-retiming contents of the output register that is being retimed backwards (in this case, register 501), and the RAM must be set to initiate a read from that location on the first cycle. In addition, in order for reads to the RAM on subsequent cycles to return the original contents that the RAM would have returned without retiming, the pre-retiming contents have to be set to be written in to that location on that first cycle as well.

In one embodiment, the following steps may be carried out to achieve the foregoing result:
 1. Change the initial post-retiming contents of the RAM at a predetermined location to the desired output contents.
 2. Set the initial post-retiming read address and write address to the address of the predetermined location and set the initial post-retiming write enable input to enable writing.
 3. Set the initial post-retiming write data to pre-retiming contents of the predetermined location.
 4. Push the pre-retiming values of the address and enable inputs backwards as in any backwards retiming.

Figure 6:
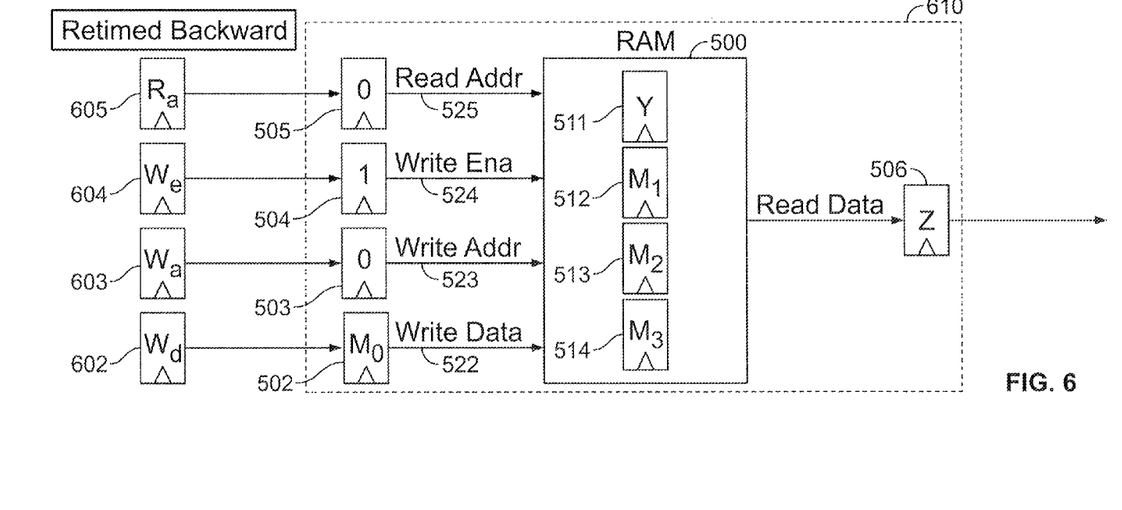
FIG. 6 shows an example of a method according to an embodiment of the present invention for backward retiming of registers through a dual-port RAM such as that of FIG. 5.

An example is shown in FIG. 6, where FIG. 5 shows the pre-retiming state of RAM 500, input/address/enable registers 502-505, and output registers 506, 507. In this example, RAM 500 is a dual-port RAM with write address $W_a$ in register 503 and read address $R_a$ in register 505. Cells 511-514 (addresses $R_a$=0, 1, 2, 3) contain data $M_0$, $M_1$, $M_2$, $M_3$, respectively, while output registers 506, 507 contain data Y and Z, respectively.

FIG. 6 shows the result of moving register 506 (or its contents) back through RAM 500. Because pre-retiming register 506 contained output data, retiming pushes the register (or its contents) back to the former location of input, or write data, register 502, with register 502 pushed back to location 602. To maintain timing, registers 503-505 are pushed back to locations 603-605. But the data Y that were in register 506 are not pushed back to register 502, but rather a location in RAM 500. While any location could have been selected, in this example, cell 511 ($R_a$=0) is selected (if, e.g., cell 513 were selected, then $R_a$=3 would be used, and so on). The former contents $M_0$ of cell 511 are moved to register 502. Data Z from register 507 are now in register 506.

The new contents of registers 503-505 are the address/enable signals needed to cause the system to assume, on the following clock, the state shown in FIG. 5. Write enable register 504 is set to '1' to allow writing to RAM 500 (this will also work if register 504 is configured as a not-enable signal and is set to '0'). Write address 503 and read address 505 are both set to '0'; because this is a dual-port RAM, both reading and writing can occur simultaneously at address '0'. Write data 502 are set to $M_0$. It will be apparent that on the next clock, Y will be propagated to register 506 because read address 505 is '0', while $M_0$ will be propagated to cell 511 because write address 503 is '0'. Z will be propagated to register 507. And the input/address/enable values in registers 602-605 will be propagated to registers 502-505, restoring the pre-retiming state.

In an embodiment where the RAM inputs and outputs are registered, as indicated by dashed line 610 which signifies optionally that registers 502-506 are inside RAM 500, the result is the same as long as the contents of registers 502-506 are able to be initialized in such an embodiment.

Figure 7:
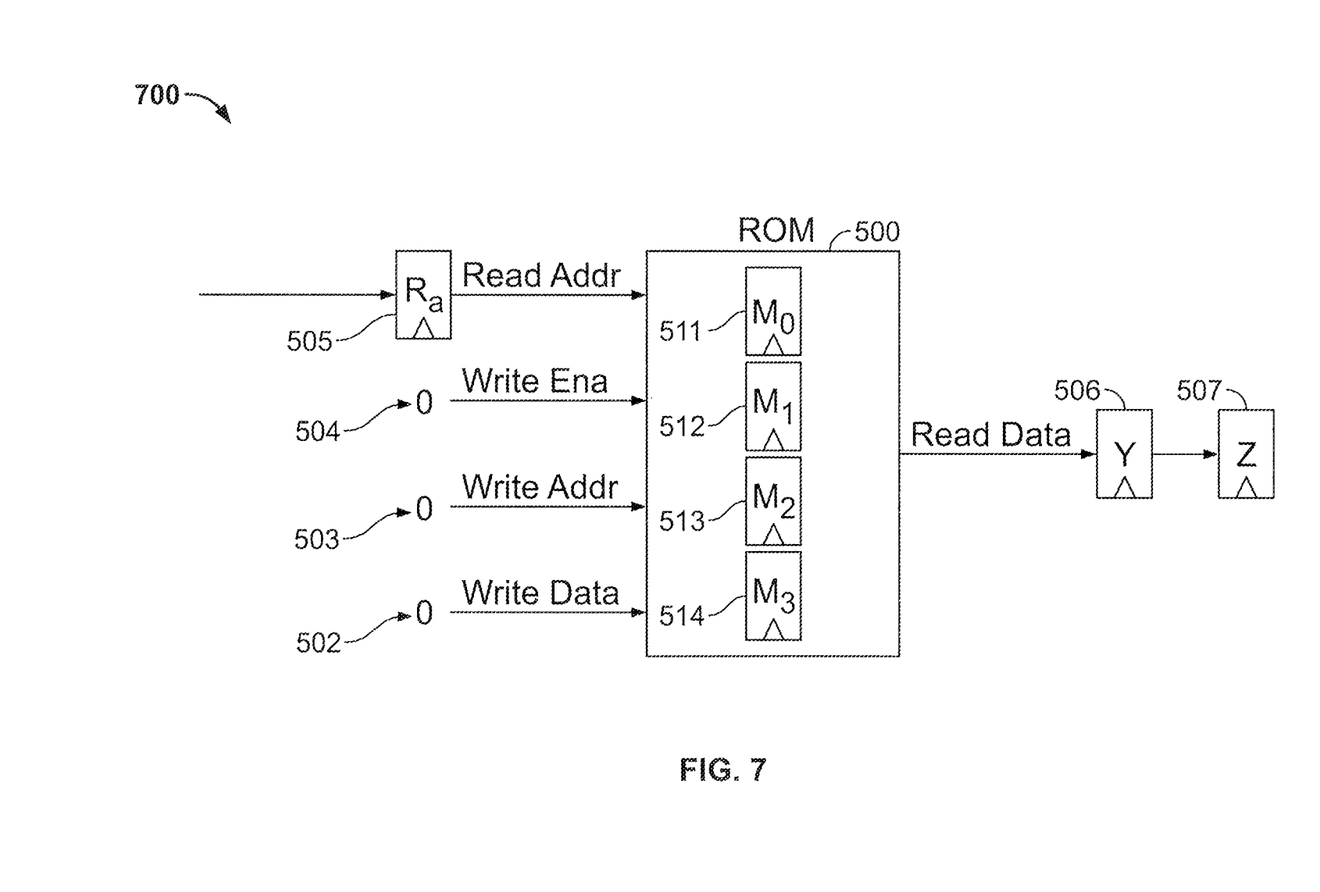
FIG. 7 shows an example of an embodiment where the RAM is configured as a ROM.

In a programmable device, a RAM can be configured as a ROM by setting each of write data register 502, write address register 503 and write enable register 504 to '0' (the values in registers 502, 503 do not actually matter as long as write enable register 504 is set to '0', but tying all three registers 502-504 to ground is convenient). An implementation 700 where the user configures RAM 500 as a ROM is shown in FIG. 7. Such an implementation can be retimed in accordance with embodiment of the invention a shown in FIG. 6, by setting $W_e$, $W_a$ and $W_d$ in registers 602-604 to all be '0'. After one clock cycle, the system will assume the state of FIG. 7, and will thenceforth act as a ROM as intended.

The embodiment of FIGS. 5 and 6 is based on a dual-port RAM. As noted above, the present invention also may be used with a single-port RAM that allows simultaneous reading from and writing to the single address. Such an embodiment is shown in FIGS. 8 and 9.

Figure 8:
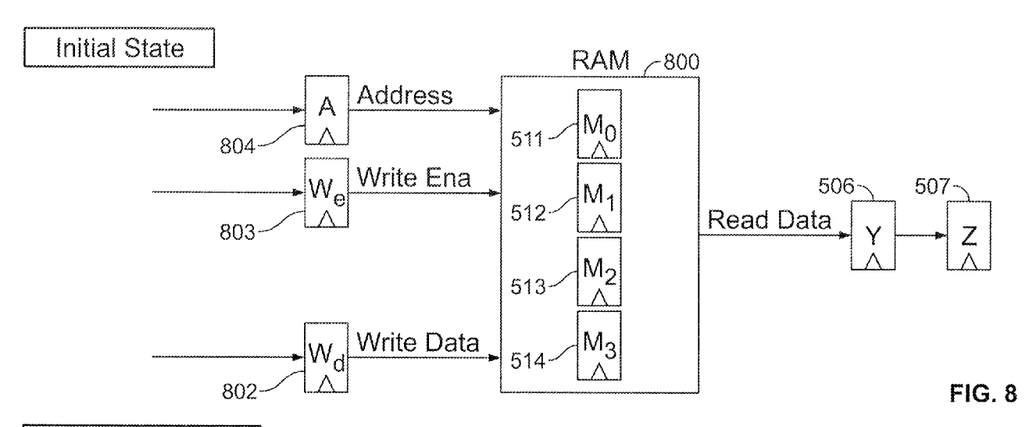
FIG. 8 shows an example of an initial state of a single-port RAM to which backward retiming of registers may be applied.

FIG. 8 shows the pre-retiming state of a single-port RAM 800, input/address/enable registers 802-804, and output registers 506, 507. In this example, the single read/write address A is in register 804. Cells 511-514 (addresses A=0, 1, 2, 3) contain data $M_0$, $M_1$, $M_2$, $M_3$, respectively, while output registers 506, 507 contain data Y and Z, respectively.

Figure 9:
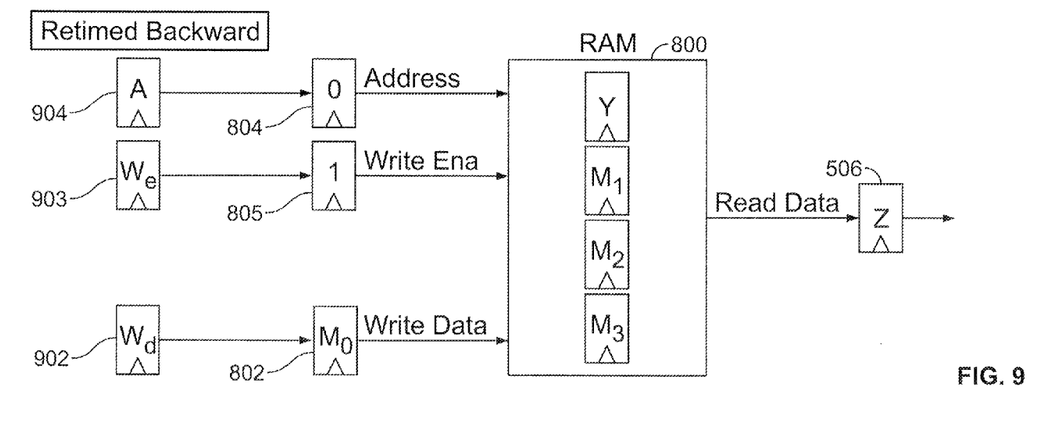
FIG. 9 shows an example of a method according to an embodiment of the present invention for backward retiming of registers through a single-port RAM such as that of FIG. 8.

FIG. 9 shows the result of moving register 506 back through RAM 800. Because pre-retiming register 506 contained output data, retiming pushes the register back to the former location of input, or write data, register 802, with register 802 pushed back to location 902. To maintain timing, registers 803, 804 are pushed back to locations 903, 904. But the data Y that were in register 506 are not pushed back to register 802, but rather a location in RAM 800. While any location could have been selected, in this example, cell 511 (A=0) is selected (if, e.g., cell 513 were selected, then A=3 would be used, and so on). The former contents $M_0$ of cell 511 are moved to register 802. Data Z from register 507 are now in register 506.

The new contents of registers 803, 804 are the address/enable signals needed to cause the system to assume, on the following clock, the state shown in FIG. 8. Write enable register 803 is set to '1' to allow writing to RAM 800 (this will also work if register 803 is configured as a not-enable signal and is set to '0'). Address 804 (A) is set to '0'; both reading and writing can occur simultaneously at that address, as noted above. Write data 802 are set to $M_0$. It will be apparent that on the next clock, because the single read/write address is '0', Y will be propagated to register 506, while $M_0$ will be propagated to cell 511. Z will be propagated to register 507. And the input/address/enable values in registers 902-904 will be propagated to registers 802-804, restoring the pre-retiming state.

It should be noted that the actual structure of the RAMs in any of the foregoing embodiments is not important. Each embodiment will function whether the RAM in question is a dedicated RAM, or configured from programmable resources of the programmable device (e.g., LUT-RAM).

Figure 10:
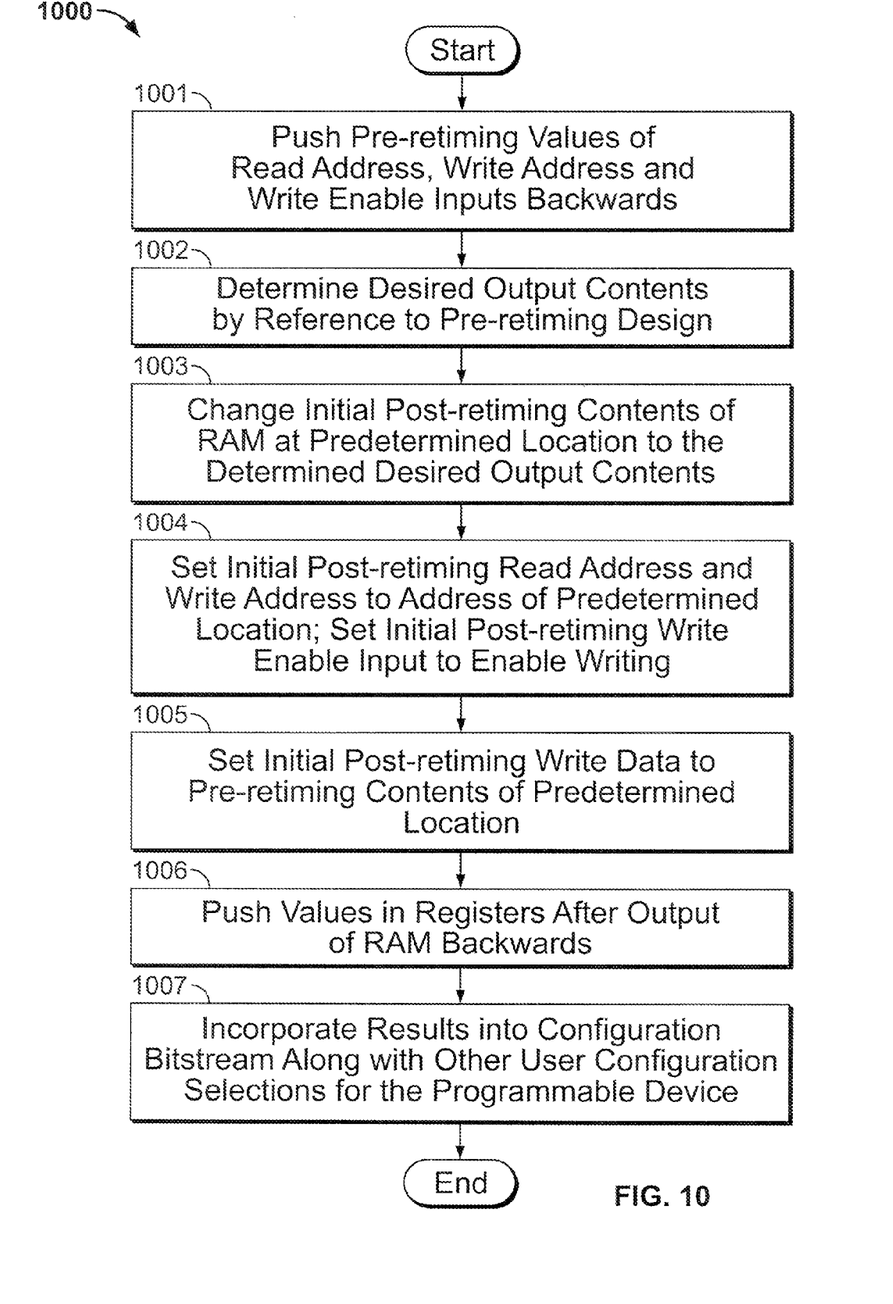
FIG. 10 is a flow diagram of a method according to an embodiment of the present invention.

One implementation of a method 1000 for backward retiming of a RAM in accordance with embodiments of the present invention is diagrammed in FIG. 10. Method 1000 begins at 1001 where the pre-retiming values of the read address, write address and write enable inputs are pushed backwards. At 1002, the desired output contents are determined by reference to a pre-retiming design. At 1003, the initial post-retiming contents of the RAM at a predetermined location are changed to the desired output contents that were determined at 1002. At 1004, the initial post-retiming read address and write address are set to the address of the predetermined location and the initial post-retiming write enable input is set to enable writing. At 1005, the initial post-retiming write data are set to the pre-retiming contents of the predetermined location. At 1006, values in registers after the output of the RAM are pushed backwards. At 1007, the results are incorporated into a configuration bitstream, along with other user configuration selections for the programmable device, and the method ends.

Thus it is seen that methods for retiming a logic design, including an initialized RAM, including moving a register backwards through the RAM, by moving the register back not only on the data path but also on the read and write address paths, and setting the values on the read and write address paths so that on the next cycle, the RAM assumes its pre-retiming initialized state, have been provided.

Instructions for carrying out a method according to this invention for programming a programmable device may be encoded on a machine-readable medium, to be executed by a suitable computer or similar device to implement the method of the invention as part of programming or configuring PLDs or other programmable devices. For example, a workstation or personal computer may be equipped with an interface to which a PLD can be connected, and the workstation or personal computer can be used by a user to program the PLD using suitable software tools as described above, to generate a configuration bitstream that can be loaded into the device via the interface.

Figure 11:
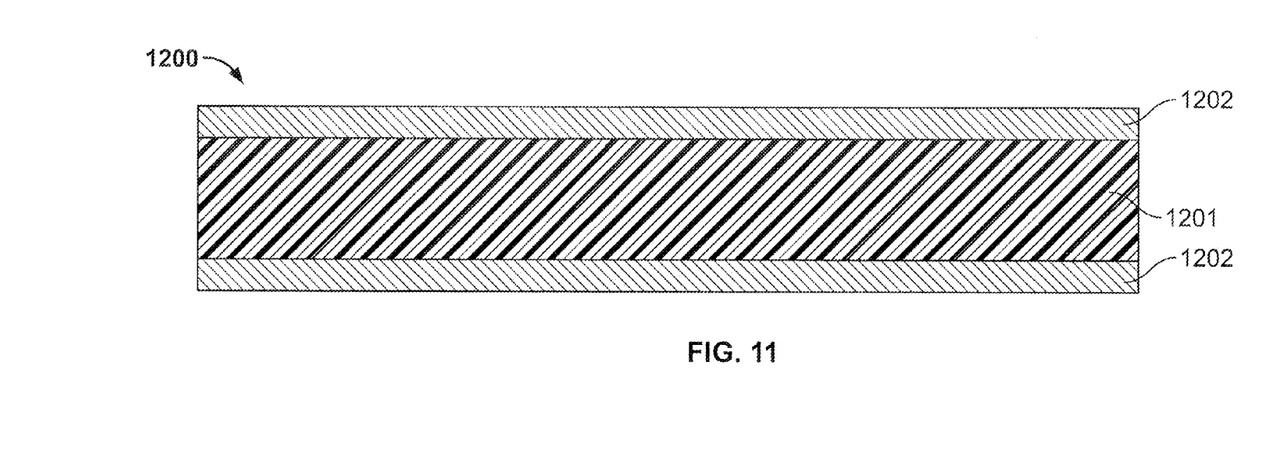
FIG. 11 is a cross-sectional view of a magnetic data storage medium encoded with a set of machine-executable instructions for performing the method according to the present invention.

FIG. 11 presents a cross section of a magnetic data storage medium 1200 which can be encoded with a machine executable program that can be carried out by systems such as the aforementioned workstation or personal computer, or other computer or similar device. Medium 1200 can be a floppy diskette or hard disk, or magnetic tape, having a suitable substrate 1201, which may be conventional, and a suitable coating 1202, which may be conventional, on one or both sides, containing magnetic domains (not visible) whose polarity or orientation can be altered magnetically. Except in the case where it is magnetic tape, medium 1200 may also have an opening (not shown) for receiving the spindle of a disk drive or other data storage device.

The magnetic domains of coating 1202 of medium 1200 are polarized or oriented so as to encode, in manner which may be conventional, a machine-executable program, for execution by a programming system such as a workstation or personal computer or other computer or similar system, having a socket or peripheral attachment into which the PLD to be programmed may be inserted, to configure appropriate portions of the PLD, including its specialized processing blocks, if any, in accordance with the invention.

Figure 12:
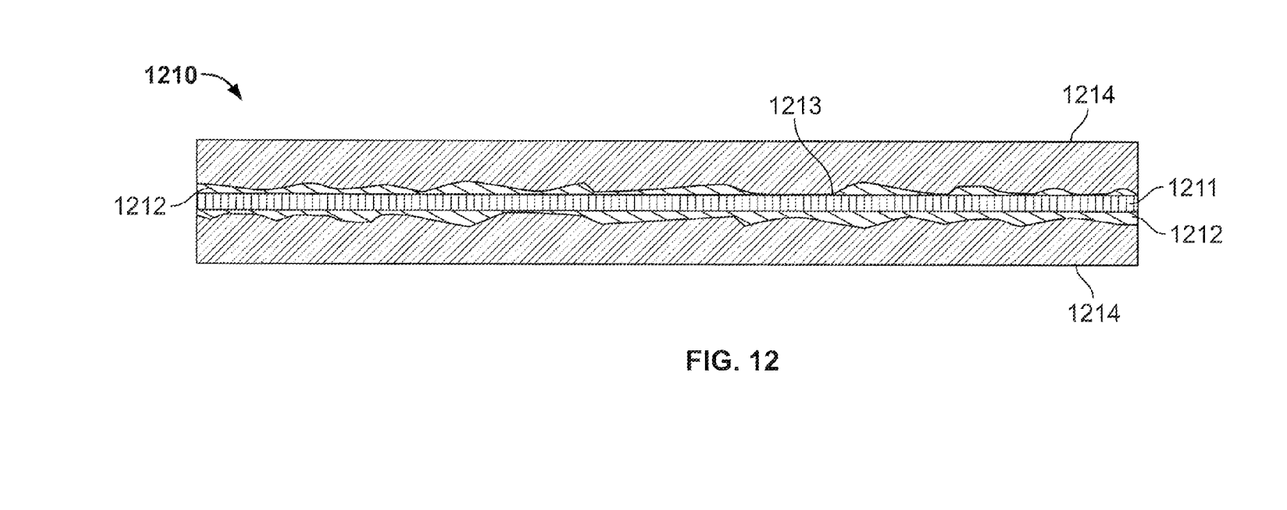
FIG. 12 is a cross-sectional view of an optically readable data storage medium encoded with a set of machine executable instructions for performing the method according to the present invention.

FIG. 12 shows a cross section of an optically-readable data storage medium 1210 which also can be encoded with such a machine-executable program, which can be carried out by systems such as the aforementioned workstation or personal computer, or other computer or similar device. Medium 1210 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 1210 preferably has a suitable substrate 1211, which may be conventional, and a suitable coating 1212, which may be conventional, usually on one or both sides of substrate 1211.

In the case of a CD-based or DVD-based medium, as is well known, coating 1212 is reflective and is impressed with a plurality of pits 1213, arranged on one or more layers, to encode the machine-executable program. The arrangement of pits is read by reflecting laser light off the surface of coating 1212. A protective coating 1214, which preferably is substantially transparent, is provided on top of coating 1212.

In the case of magneto-optical disk, as is well known, coating 1212 has no pits 1213, but has a plurality of magnetic domains whose polarity or orientation can be changed magnetically when heated above a certain temperature, as by a laser (not shown). The orientation of the domains can be read by measuring the polarization of laser light reflected from coating 1212. The arrangement of the domains encodes the program as described above.

A PLD 1500 programmed according to the present invention may be used in many kinds of electronic devices. One possible use is in a data processing system 1400 shown in FIG. 13. Data processing system 1400 may include one or more of the following components: a processor 1401 (including RAM 500); memory 1402; I/O circuitry 1403; and peripheral devices 1404. These components are coupled together by a system bus 1405 and are populated on a circuit board 1406 which is contained in an end-user system 1407.

Figure 13:
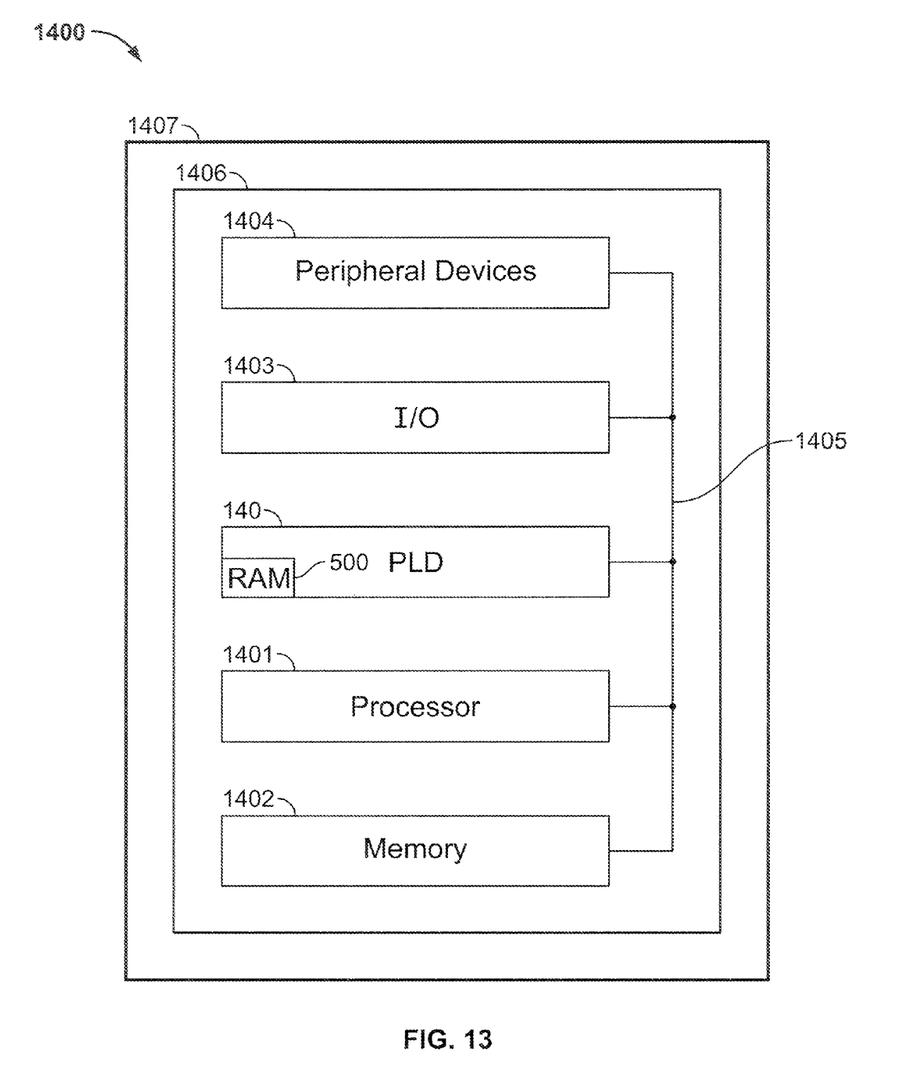
FIG. 13 is a simplified block diagram of an illustrative system employing a programmable logic device incorporating the present invention.

System 1400 can be used in a wide variety of applications, such as computer networking, data networking, instrumentation, video processing, digital signal processing, or any other application where the advantage of using programmable or reprogrammable logic is desirable. PLD 140 can be used to perform a variety of different logic functions. For example, PLD 1500 can be configured as a processor or controller that works in cooperation with processor 1401. PLD 1500 may also be used as an arbiter for arbitrating access to a shared resources in system 1400. In yet another example, PLD 1500 can be configured as an interface between processor 1401 and one of the other components in system 1400. It should be noted that system 1400 is only exemplary, and that the true scope and spirit of the invention should be indicated by the following claims.

Various technologies can be used to implement PLDs 1500 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A method of configuring an integrated circuit device with a user logic design incorporating an initialized random-access memory ("RAM"), said method comprising:
   identifying initialization conditions of said RAM and of an output thereof;
   retiming said RAM by:
   moving initialization values of input, address and enable registers of said RAM within said integrated circuit device, and moving an initialization value of said output to a memory location in said RAM, and
   setting new values of said input, address and enable registers so that starting from those new values, said RAM will achieve said initialization conditions after one clock cycle;
   incorporating said initialization values and said new values into a configuration for said integrated circuit device; and
   applying said configuration to said integrated circuit device.

2. The method of claim 1 wherein:
   said integrated circuit device is a programmable integrated circuit device;
   said incorporating comprises incorporating said initialization values and said new values into a configuration bitstream for said programmable integrated circuit device; and
   said applying comprises storing said configuration bitstream in memory of said programmable integrated circuit device.

3. The method of claim 1 wherein:
   said RAM is a dual-port RAM; and
   said setting new values comprises setting both a read address and a write address to said memory location in said RAM.

4. The method of claim 1 wherein:
   said RAM is a single-port RAM that allows, at one address, simultaneous writing of a new value and reading of an old value; and
   said setting new values comprises setting an address to said memory location in said RAM.

5. The method of claim 1 wherein:
   said setting new values comprises setting said input register to a retimed value determined by said identifying to be an initialization condition of said memory location.

6. The method of claim 1 wherein:
   said initialization value of said enable register disables writing to said RAM;
   said setting new values comprises setting a new value of said enable register to enable writing to said RAM; and
   after said one clock cycle, said RAM is configured as a read-only memory with said retimed value from said input register written into said memory location.

7. A programmable integrated circuit device configured in accordance with the method of claim 1.

8. A non-transitory machine readable storage medium encoded with instructions for performing a method of configuring an integrated circuit device with a user logic design incorporating an initialized random-access memory ("RAM"), said instructions comprising:
- instructions to identify initialization conditions of said RAM and of an output thereof;
- instructions to retime said RAM, including:
- instructions to move initialization values of input, address and enable registers of said RAM within said integrated circuit device, and to move an initialization value of said output to a memory location in said RAM, and
- instructions to set new values of said input, address and enable registers so that starting from those new values, said RAM will achieve said initialization conditions after one clock cycle;
- instructions to incorporate said initialization values and said new values into a configuration for said integrated circuit device; and
- instructions to apply said configuration to said integrated circuit device.

9. The non-transitory machine readable storage medium of claim 8 wherein:
- said integrated circuit device is a programmable integrated circuit device;
- said instructions to incorporate comprise instructions to incorporate said initialization values and said new values into a configuration bitstream for said programmable integrated circuit device; and
- said instructions to apply comprise instructions to store said configuration bitstream in memory of said programmable integrated circuit device.

10. The non-transitory machine readable storage medium of claim 8 wherein:
- said RAM is a dual-port RAM; and
- said instructions to set new values comprise instructions to set both a read address and a write address to said memory location in said RAM.

11. The non-transitory machine readable storage medium of claim 8 wherein:
- said RAM is a single-port RAM that allows, at one address, simultaneous writing of a new value and reading of an old value; and
- said instructions to set new values comprise instructions to set an address to said memory location in said RAM.

12. The non-transitory machine readable storage medium of claim 8 wherein:
- said instructions to set new values comprise instructions to set said input register to a retimed value determined by execution of said instructions to identify to be an initialization condition of said memory location.

13. The non-transitory machine readable storage medium of claim 12 wherein:
- said initialization value of said enable register disables writing to said RAM;
- said instructions to set new values comprise instruction to set a new value of said enable register to enable writing to said RAM; whereby:
- after said one clock cycle, said RAM is configured as a read-only memory with said retimed value from said input register written into said memory location.

14. A method of retiming a circuit that includes a random-access memory ("RAM") having data stored therein, a register following said RAM, and registers preceding said RAM for registering input, address and enable signals of said RAM, said method comprising:
- moving a value in said register following said RAM into a memory location in said RAM;
- moving data stored in said RAM and initial values in said registers preceding said RAM to accommodate said value moved from said register following said RAM; and
- setting new values in said registers preceding said RAM so that, on a first clock cycle after retiming, said circuit assumes a condition before retiming.

15. The method of claim 14 further comprising, prior to said moving a value, determining said condition.

16. The method of claim 14 wherein said circuit is a programmable integrated circuit device, said method further comprising:
- incorporating said value in said register following said RAM, said data stored in said RAM, said initial values in said registers preceding said RAM, and said new values, into a configuration for said programmable integrated circuit device; and
- applying said configuration to said programmable integrated circuit device.

17. The method of claim 16 wherein
- said incorporating comprises incorporating said value in said register following said RAM, said data stored in said RAM, said initial values in said registers preceding said RAM, and said new values into a configuration bitstream for said programmable integrated circuit device; and
- said applying comprises storing said configuration bitstream in memory of said programmable integrated circuit device.

18. The method of claim 14 wherein:
said RAM is a dual-port RAM; and
said setting new values comprises setting both a read address and a write address to said memory location in said RAM.

19. The method of claim 14 wherein:
said RAM is a single-port RAM that allows, at one address, simultaneous writing of a new value and reading of an old value; and
said setting new values comprises setting an address to said memory location in said RAM.

20. The method of claim 14 wherein:
an initialization value of said enable signal in a register preceding said RAM disables writing to said RAM;
said setting new values comprises setting a new value of said enable register to enable writing to said RAM, said enable signal that disables writing being moved to another location; and
after said first clock cycle, said enable signal that disables writing is written back to said enable register so that said RAM is configured as a read-only memory, and said value moved from said register following said RAM is written back into said memory location.

* * * * *